(12) United States Patent
Ouyang (10) Patent No.: US 10,845,704 B2
(45) Date of Patent: Nov. 24, 2020

(54) EXTREME ULTRAVIOLET PHOTOLITHOGRAPHY METHOD WITH INFILTRATION FOR ENHANCED SENSITIVITY AND ETCH RESISTANCE

(71) Applicant: Taiwan Semiconductor Manufacturing Co., Ltd., Hsin-Chu (TW)

(72) Inventor: Christine Y Ouyang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/444,175

(22) Filed: Jun. 18, 2019

(65) Prior Publication Data

US 2020/0133131 A1 Apr. 30, 2020

Related U.S. Application Data

(60) Provisional application No. 62/752,692, filed on Oct. 30, 2018.

(51) Int. Cl.
*G03F 7/32* (2006.01)

(52) U.S. Cl.
CPC .................................. *G03F 7/32* (2013.01)

(58) Field of Classification Search
CPC ......... G03F 7/0041–0045; G03F 7/028; G03F 7/0285; G03F 7/06; G03F 7/063; G03F 7/32; G03F 7/70033
USPC .................... 355/27, 77; 430/270.1, 322, 323
See application file for complete search history.

(56) References Cited

U.S. PATENT DOCUMENTS

| 8,152,922 B2* | 4/2012 | Schmidt ............ C23C 16/45512 |
| | | 118/715 |
| 8,796,666 B1 | 8/2014 | Huang et al. |
| 9,093,530 B2 | 7/2015 | Huang et al. |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 2012/0241411 A1* | 9/2012 | Darling .................. G03F 7/405 |
| | | 216/67 |
| 2017/0271150 A1* | 9/2017 | Chang ..................... G03F 7/162 |

(Continued)

OTHER PUBLICATIONS

A. Singh, et al., "Impact of Sequential Infiltration Synthesis on Patten Fidelity of DSA Lines", Proceedings of SPIE 9425, Advances in Patterning Material s and Processes XXXII, 94250N (Mar. 20, 2015), doi:10.1117/12.2086091.

*Primary Examiner* — Colin W Kreutzer
(74) *Attorney, Agent, or Firm* — Haynes and Boone, LLP (57) ABSTRACT

The present disclosure provides a method for lithography patterning in accordance with some embodiments. The method includes forming a photoresist layer over a substrate; performing an infiltration process to introduce a metallic compound into the photoresist to enhance a sensitivity of the photoresist layer to an extreme ultraviolet (EUV) radiation; performing an exposing process to the photoresist layer using the EUV radiation; and performing a developing process to the photoresist layer to form a patterned resist layer.

20 Claims, 8 Drawing Sheets

(56) References Cited

U.S. PATENT DOCUMENTS

| | | | |
|---|---|---|---|
| 2018/0173109 A1* | 6/2018 | Gronheid | G03F 7/0002 |
| 2018/0240667 A1* | 8/2018 | Yu | H01L 21/31138 |
| 2019/0056914 A1* | 2/2019 | Ma | G03F 7/38 |
| 2019/0163056 A1* | 5/2019 | Maes | G03F 7/16 |
| 2019/0189428 A1* | 6/2019 | De Silva | H01L 21/0273 |
| 2019/0196340 A1* | 6/2019 | De Silva | G03F 1/54 |

\* cited by examiner

EXTREME ULTRAVIOLET PHOTOLITHOGRAPHY METHOD WITH INFILTRATION FOR ENHANCED SENSITIVITY AND ETCH RESISTANCE

This application claims the benefit of U.S. Provisional Application 62/752,692 entitled "Lithography Process with Improved Sensitivity and Etch Resistance," filed Oct. 30, 2018, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. For example, as the semiconductor fabrication continues to shrink pitches below 20 nm nodes, traditional i-ArF were confronted a huge challenge. The optical restriction leads to resolution and lithography performance that cannot meet targets. Extreme ultraviolet (EUV) lithography has been utilized to support critical dimension (CD) requirements of smaller devices. EUV lithography employs scanners using radiation in the EUV region, having a wavelength of about 1 nm to about 100 nm. Some EUV scanners provide 4× reduction projection printing onto a resist film coated on a substrate, similar to some optical scanners, except that the EUV scanners use reflective rather than refractive optics. EUV lithography has imposed a complex set of requirements upon the photoresist film. The photo acid generator (PAG) in ArF resist absorbs 193 nm wave and generates photoacid, and the acid has 1000 times chemical amplifier reaction (CAR) and deprotects acid labile group. However, the existing photoresist is not sensitive to EUV. Due to low source power of EUV tool and other factors, photoresist is not efficient to generate enough acid for desired resolution, leading to various patterning issues, such as line width roughness and CD uniformity. What are needed are a photoresist and a method of lithography patterning to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to methods for semiconductor device fabrication, and more particularly to a lithography patterning process associated extreme ultraviolet (EUV) radiation. In lithography patterning, after a photoresist (or simply resist) film is exposed to a radiation, such as a EUV radiation, it is developed in a developer (a chemical solution). The developer removes portions (such as exposed portions as in a positive-tone photoresist or unexposed portions as in a negative-tone photoresist) of the photoresist film, thereby forming a photoresist pattern which may include line patterns and/or trench patterns. The photoresist pattern is then used as an etch mask in subsequent etching processes, transferring the pattern to an underlying material layer. Alternatively, the photoresist pattern is then used as an ion implantation mask in subsequent ion implantation processes applied to the underlying material layer, such as an epitaxial semiconductor layer.

Generally, to produce the smallest possible circuitry, most advanced lithography systems are designed to use light of very short wavelength such as for example, deep-ultraviolet light at a wavelength at or below 200 nm, or extreme ultraviolet (EUV) in the region of about 13.5 nm. Such light sources are relatively weak, so the photosensitive films (e.g., a photoresist) need to be designed to utilize this light as efficiently as possible. Essentially photoresists used today for microelectronic/Nano-electronic fabrication employ the concept of chemical amplification to enhance the efficiency of light utilization.

A photoresist that employs the chemical amplification is generally referred to as a "chemically amplified resist (CAR)". The photoresist includes a polymer that resists to etching or ion implantation during semiconductor fabrication; an acid generating compound (e.g., photo acid generator (PAG)); and a solvent. In some examples, the polymer also includes at least one acid labile group (ALG) that responds to acid. PAG absorbs radiation energy and generates acid. The polymer and the PAG are mixed in the solvent before the photoresist is applied to a workpiece, such as a semiconductor wafer, during a lithography process. The PAG is not sensitive to the EUV radiation. That is, advance to improve lithography efficiency (e.g., resolution/contrast, line-width-roughness, and sensitivity) encounters issues. Due to limited source power of a EUV lithography system, an existing photoresist cannot provide imaging effect during a lithography exposure process with desired resolution and contrast. Therefore, the disclosed photoresist further includes a method to incorporate metal-containing chemical to increase the sensitivity of the photoresist. The metal-containing chemical may function as a sensitizer or through other mechanism to increase the sensitivity, which will be further explained later. For example, the sensitizer is sensitive to EUV radiation, absorbs EUV radiation and generates electron. Thus, the PAG absorbs electron and generates acid.

Incorporating the metal-containing chemical into the photoresist needs newly designed photoresist with different composition and a method to synthesize new photoresist, which is costly to fabrication. Further, the photoresist may need to be tuned to have other physical characteristics, such as etch resistance, to certain processes. This makes the composition of the photoresist and the synthesis of the corresponding photoresist harder to be aligned to an individual patterning process flow. The present disclosure addresses the above issues by a method including one or more filtration at certain fabrication stage(s), therefore eliminating the synthesis of new photoresist for EUV lithography process.

Figure 1:
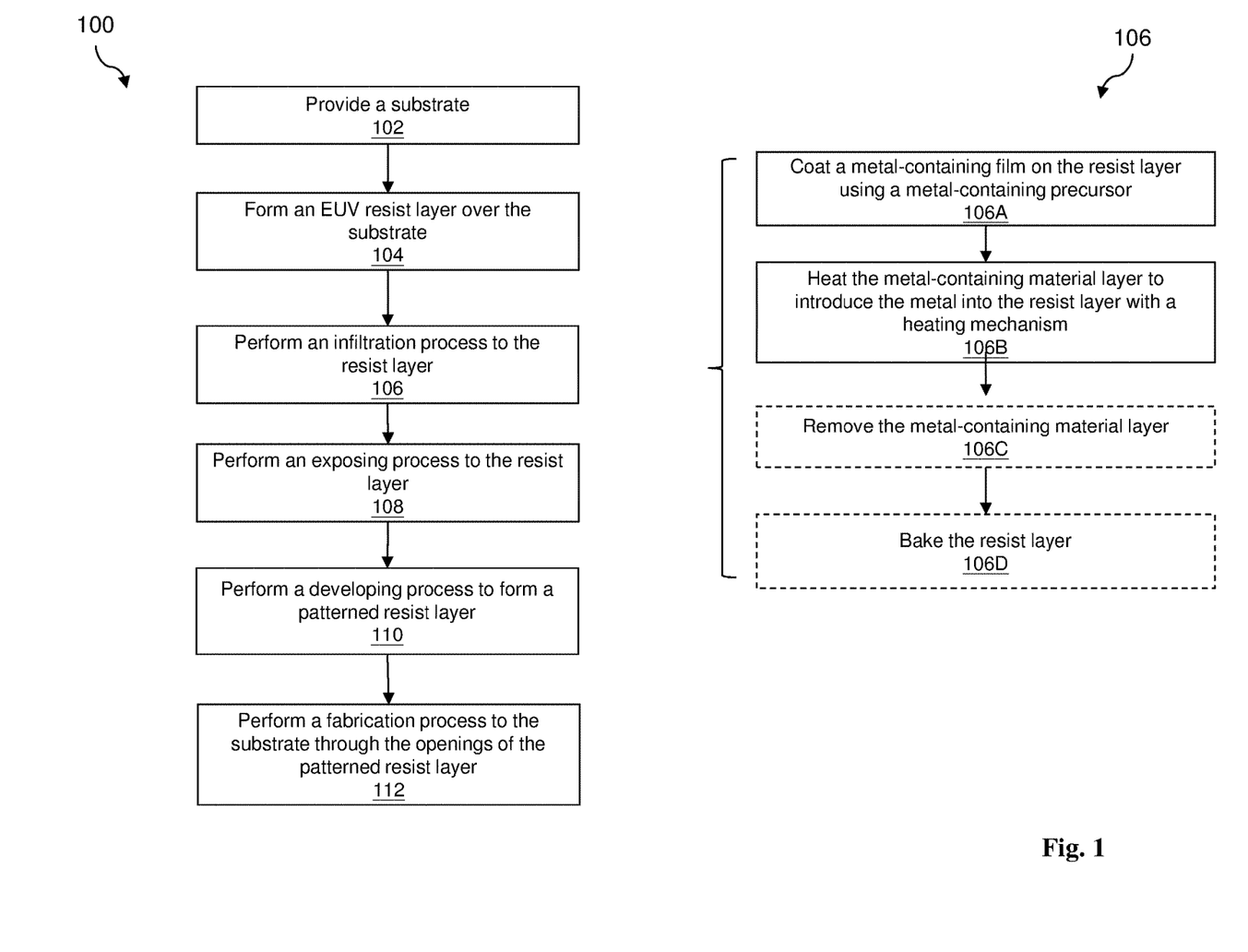
FIG. 1 illustrates a flowchart of a lithography patterning method in accordance with some embodiments.

FIG. 1 is a flowchart of a method 100 of patterning a substrate (e.g., a semiconductor wafer) according to various aspects of the present disclosure in some embodiments. The method 100 may be implemented, in whole or in part, by a system employing advanced lithography processes with radiation such as, extreme ultraviolet (EUV) light, or alternatively other radiation such as deep ultraviolet (DUV) light, electron beam (e-beam) lithography, or x-ray lithography to improve pattern dimension accuracy. In the present embodiment, EUV lithography is used as the primary example. Additional operations can be provided before, during, and after the method 100, and some operations described can be replaced, eliminated, or moved around for additional embodiments of the method.

FIGS. 5A through 5F are sectional views of a semiconductor structure (or workpiece) 200 at various fabrication stages, constructed in accordance with some embodiments. The method 100 is described below in conjunction with FIG. 1 and FIGS. 5A through 5F wherein the semiconductor structure 200 is fabricated by using embodiments of the method 100. The semiconductor structure 200 may be an intermediate workpiece during the fabrication of an integrated circuit (IC), or a portion thereof. The IC may include logic circuits, memory structures, passive components (such as resistors, capacitors, and inductors), and active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, such as gate-all-around, (GAA) FETs, nanowire transistors, nanosheet transistors, and combinations thereof.

Figure 5A:
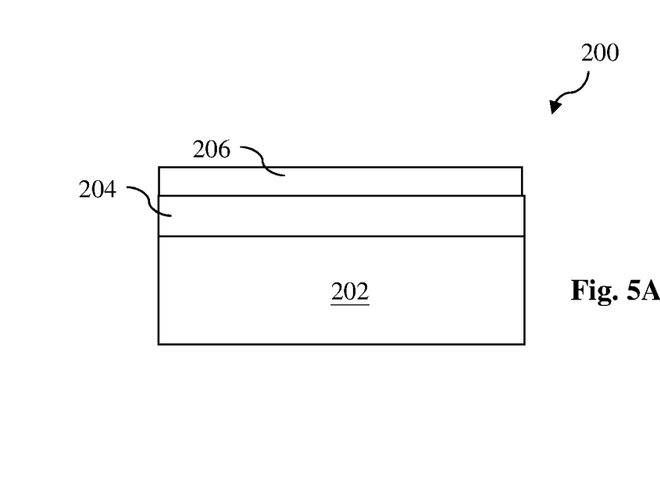
FIGS. 5A, 5B, 5C, 5D, 5E, 5F and 5G illustrate cross-sectional views of a semiconductor structure at various fabrication stages, in accordance with some embodiments.

Referring now to FIG. 1 in conjunction with FIG. 5A, the method 100 begins at block 102 with a semiconductor structure 200. The semiconductor structure 200 includes a substrate 202. In an embodiment, the substrate 202 is a semiconductor substrate (e.g., wafer). In furtherance of the embodiment, the substrate 202 includes silicon in a crystalline structure. In alternative embodiments, the substrate 202 includes other elementary semiconductors such as germanium, or a compound semiconductor such as silicon carbide, gallium arsenide, indium arsenide, and indium phosphide. The substrate 202 includes one or more layers of material or composition. The substrate 202 may include a silicon on insulator (SOI) substrate, be strained/stressed for performance enhancement, include epitaxial regions, include isolation regions, include doped regions, include one or more semiconductor devices or portions thereof, include conductive and/or non-conductive layers, and/or include other suitable features and layers. In some embodiments, the substrate 202 includes a pair of semiconductor materials (such as silicon and silicon germanium) alternatively stacked by epitaxial growths for making the nanowire transistors or nanosheet transistors.

In the present embodiment, the substrate 202 includes an underlayer (or material layer) 204 to be processed, such as to be patterned or to be implanted. For example, the underlayer 204 is a hard mask layer to be patterned. In another example, the underlayer 204 is an epitaxial semiconductor layer to be ion implanted. However, in an alternative embodiment, the substrate 202 may not include an underlayer. In an embodiment, the underlayer 204 is a hard mask layer including material(s) such as silicon oxide, silicon nitride (SiN), silicon oxynitride, or other suitable material or composition. In an embodiment, the underlayer 204 is an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer 204 may include a high-k dielectric layer, a gate layer, a hard mask layer, an interfacial layer, a capping layer, a diffusion/barrier layer, a dielectric layer, a conductive layer, other suitable layers, and/or combinations thereof.

In some embodiments, the structure 200 may be alternatively a photomask used to pattern a semiconductor wafer. In furtherance of the embodiments, the substrate 202 is a photomask substrate that may include a transparent material (such as quartz), or a low thermal expansion material such as silicon oxide-titanium oxide compound. The photomask substrate may further include a material layer to be patterned. To further this example, the photomask may be used radiation, such as I-line light, or a deep ultraviolet (DUV) light (e.g., 248 nm radiation by krypton fluoride (KrF)

excimer laser or 193 nm radiation by argon fluoride (ArF) excimer laser). Accordingly, the underlayer 204 is material layer to be patterned to define a circuit pattern. For example, the underlayer 204 is an absorber layer, such as chromium layer for DUV photomask or other suitable material.

The method 100 proceeds to operation 104 by forming a photoresist layer (or simply resist layer) 206 over the substrate 202 (FIG. 5A), such as over the underlayer 204. The resist layer 206 is sensitive to radiation used in a lithography exposing process and has a resistance to etch (or ion implantation). In the present embodiment, the resist layer 206 is sensitive to EUV radiation. In some embodiments, the resist layer 206 includes dual layer or tri-layer for lithography patterning. For example, the tri-layer resist includes a bottom layer, a middle layer on the bottom layer and a photosensitive layer on the middle layer. The bottom and middle layers are designed with different composition for etch selectivity. In furtherance of the example, the bottom layer is a carbon-rich polymeric material and the middle layer is a silicon-rich material. In FIG. 5A, only photosensitive layer is illustrated and is referred to as resist layer 206. However, it is only for illustration without limiting. It may include additional layer, such as those in the dual layer or tri-layer resist scheme. Referring to FIG. 5A, the resist layer 206 is formed by spin-on coating process in an embodiment. In some embodiments, the resist layer 206 is further treated with a soft baking process. The soft baking process may have a lower baking temperature than the usual soft baking. For example, the soft baking process has a baking temperature ranging between 60° C. and 80° C.

The resist layer 206 is sensitive to a radiation, such as a DUV light, or a EUV light (e.g., 13.5 nm light), an electron beam (e-beam), and an ion beam. In the present embodiment, the resist layer 206 is sensitive to EUV radiation and is used in an EUV lithography process. However, the EUV sensitivity of the resist layer 206 is needed to be enhanced through subsequent operations in the method 100.

Figure 8:
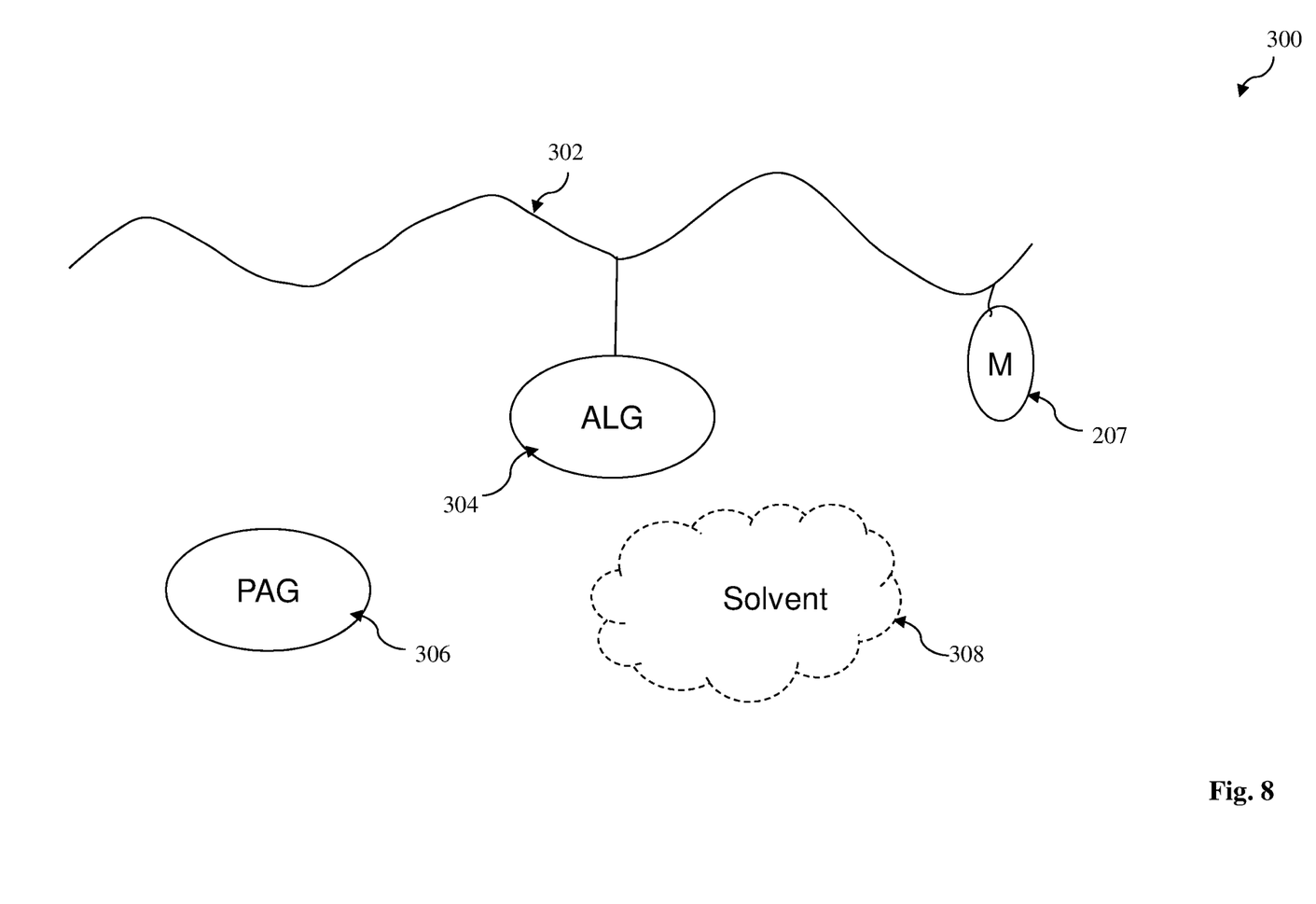
FIG. 8 illustrates a photoresist material of FIG. 5A in accordance with some embodiments.

FIG. 8 shows a resist material 300 of the resist layer 206, constructed in accordance with some embodiments. In the present example, the resist material 300 utilizes a chemical amplification (CA) resist material. For example, the CA resist material is negative tone and includes a polymer material that turns insoluble to a developer such as a base solution after the polymer is reacted with acid. In another example, the CA resist material is positive tone and includes a polymer material that turns soluble to a developer after the polymeric material is reacted with acid. In yet another example, the CA resist material includes a polymer material that changes its polarity after the polymer is reacted with acid.

The resist material 300 is sensitive to a radiation, such as extreme ultraviolet (EUV) light, from the radiation source of a lithography system. However, as noted above, the resist material 300 is not sensitive enough to EUV light and therefore needs to be boosted. The resist material 300 includes a polymer 302 to provide resistance to etch (or ion implantation). In various embodiments, the polymer 302 includes a poly(norbornene)-co-malaic anhydride (COMA) polymer, a polyhydroxystyrene (PHS) polymer, or an acrylate-based polymer. For example, the acrylate-based polymer includes a poly (methyl methacrylate) (PMMA) polymer. The polymer 302 also includes multiple side locations that may chemically bond with other chemicals. For example, the PHS polymer incudes a plurality of hydroxyl (OH) groups that may chemically bond to other chemicals.

In some examples, the resist material 300 further includes a blocking group 304, such as acid labile group (ALG) or dissolution inhibitor that responds to acid. In the present embodiment, the blocking group 304 is chemically bonded to the polymer 302, such as bonded to the OH groups of PHS in one example. The ALG is a chemical group that is deprotected by photoacid generator (PAG) in exposed areas of the resist layer. Thus, the exposed resist material 300 may change polarity and dissolubility. For example, the exposed resist material has an increased dissolubility in a developer (for a positive-tone resist) or decreased dissolubility in a developer (for a negative-tone resist). When the exposing dose of the lithography exposing process reaches a dose threshold, the exposed resist material will be dissoluble in the developer or alternatively the exposed resist material will be soluble in the developer. In one example, the ALG includes a t-butoxycardbonyl (tBOC).

The resist material 300 includes an acid generating compound, such as PAG 306. The PAG 306 absorbs radiation energy and generates acid. The resist material 300 also includes a solvent 308. The polymer 302 and the PAG 306 are mixed in the solvent 308 before the resist material is applied to a workpiece, such as a semiconductor wafer, during a lithography process. In some embodiments, the PAG 306 includes a phenyl ring. In a particular example, the PAG 306 includes a sulfonium cation, such as a triphenyl-sulfonium (TPS) group; and an anion, such as a triflate anion. Particularly, the cation of the PAG has a chemical bond to a sulfur and an additional chemical bond such that the sensitivity (or absorption) of the PAG 306 to the electron (or other type of the second radiation) is increased.

Existing PAG is substantially not sensitive to EUV radiation. The organic elements in the PAG or resist, such as carbon (C), and nitrogen (N) are weak in EUV photon absorption. In the present disclosure, the subsequent operations after the coating of the resist layer 206 will treat the resist layer 206 to further introduce metal or metal oxide to enhance the EUV sensitivity and/or increase the etch resistance.

Figure 5B:
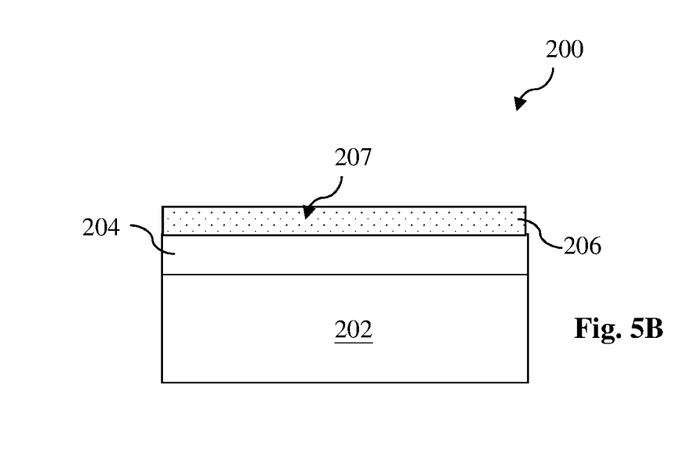

Referring now to FIG. 1 in conjunction with FIG. 5B, the method includes an operation 106 by performing an infiltration process to the resist layer 206, thereby introduce a metallic compound 207 (such as a metal, a metal oxide, or a combination thereof) into the resist layer 206. In some examples, the metallic compound 207 may include metal nitride. By the infiltration process 106, the resist layer 206 is changed in composition with addition of the metallic compound 207 and gains different material characteristics, such as enhanced radiation sensitivity and increased etch resistance. During the infiltration process, the metallic compound 207 is infiltrated into the resist layer 206 and is incorporated in the polymer material of the resist layer 206, such as being reacted with, dispersed in, or chemically bonded with the polymer material of the resist layer 206, as illustrated in FIG. 8. In some embodiments, the metallic compound 207 has a size ranging between about 2 nm and about 3 nm.

The infiltration process 106 may be implemented using an atomic layer deposition (ALD) technology or a chemical vapor deposition (CVD) technology. The ALD technology is a cyclic process with multiple cycles. Each cycle further includes a first half cycle and a second half cycle. The number of cycles determines a total amount of the metallic compound to be incorporated in the resist layer 206. Taking the metallic compound of alumina as one example. In the first half cycle, the precursor is an organometallic, such as trimethylaluminum ($Al_2(CH_3)_6$ or TMA). The organometallic precursor is reacted with the polymer material of the resist layer 206. In the second half cycle, an oxidant, such as water, is used as precursor to be reacted with the organometallic group to form the metallic compound. In the present embodiment, the metallic compound is alumina. Between the half cycles, a nitrogen purge is applied to prepare the surface of the resist layer 206 for the subsequent half cycle. The processing temperature of the ALD process is higher than the room temperature. Such as ranging between 80° C. to 100° C., according to some embodiments. For example, the substrate 202 is maintained at the processing temperature, such as between 80° C. to 100° C. Thus, in one cycle, the ALD process includes applying a TMA precursor, nitrogen purge, applying water, and nitrogen purge. This is repeated multiple cycles until the desired concentration of alumina is incorporated into the resist layer 206.

In the CVD process to incorporate alumina into the resist layer 206, TMA and water are used as a precursor to form the metallic compound in the polymer material of the resist layer 206. The CVD processing condition includes a higher temperature, such as a temperature ranging from 80° C. to 100° C. In some examples, the water is held at a high temperature, such as a temperature in a range from 80° C. to 100° C. In some embodiments, the substrate 202 is maintained at a higher temperature, such as between 80° C. to 100° C. The amount of the metallic compound 207 incorporated into the resist layer 206 is associated with various parameters of the infiltration process 106, such as the coating temperature and the partial pressure of the corresponding metal-containing precursor, such as the TMA partial pressure. In some embodiments, the metallic compound 207 infiltrated in the resist layer 206 has a weight concentration ranging between about 5% and about 10%.

The resist layer 206 treated by the infiltration may include the metallic compound 207 distributed nonuniformly in the resist layer 206. This nonuniform distribution can be achieved by choosing proper solvent or utilizing weight of the metallic compound 207. In one example, the concentration of the metallic compound 207 in the resist layer 206 has a graded concentration that increases from the top surface to the bottom surface. This graded distribution leads to nonuniform EUV sensitivity, which can compensate the footing issue caused by the lithography exposing process.

In some embodiments, the infiltration process 106 may uses a spin-on coating process using a metal-containing chemical with a suitable solvent, such as propylene glycol monomethyl ether acetate (PGMEA) to introduce a metallic compound into the resist layer 206. The spin rate ranges between 500 rpm and 4000 rpm, according to some embodiments.

Figure 5C:
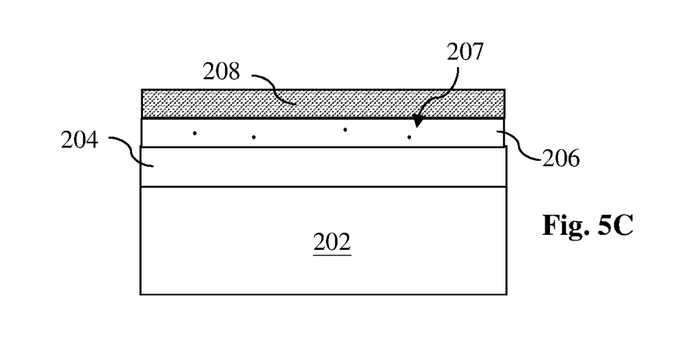

With some technologies (such as spin-on coating), a metal-containing material 208 may be formed on the resist layer 206 during the filtration process 106, as illustrated in FIG. 5C. In this case, the infiltration process 106 includes multiple steps, such as steps 106A through 106D as illustrated at left of FIG. 1. In the present embodiment, the infiltration process 106 includes a step 106A to coat metal-containing material 208 on the resist layer 206, such as by spin-on coating process. The metal-containing material 208 includes the metallic compound 207 (such as alumina) and a solvent so that the metal-containing material 208 is in a liquid state for better infiltration.

The infiltration process 106 further includes a step 106B to heat the metal-containing material 208 during a soaking time to enhance the infiltration process. During the soaking time, the metallic compound 207 in the metal-containing material 208 is diffused into the resist layer 206 and may further react with the polymer material of the resist layer 206. The heating process may be directly or indirectly applied to the metal-containing material 208. In some examples, the metal-containing material 208 is heated through a suitable heating mechanism, such as infrared radiation, microwave, eddy current, electrical resistor, or a combination thereof. In some embodiments, the metal-containing solution is preheated before it is applied to the resist layer 206.

During the soaking time, the metallic compound 207 (such as metal or metal oxide) is infiltrated from the metal-containing material 208 into the resist layer 206 and may further be reacted with the polymer of the resist layer 206, such as through diffusion, absorption and/or nucleation on functional species (e.g., carbonyl group C=O). The metallic compound 207 may be chemically bonded to the polymer to have a bond, such as M-CH$_3$. The amount of alumina incorporated into the resist layer 206 is associated with various parameters of the infiltration process 106, such as the soaking time and heating temperature (e.g., in a range between 80° C. to 100° C., according to some examples). Therefore, the amount of alumina (or other metal or metal oxide) is controlled by the step 106A, the step 106B (such as the heating temperature) and a subsequent step 106C to remove (the starting time of that determines the soaking duration). Thus, the concentration of the metallic compound 207 infiltrated into the resist layer 206 can be fine-tuned and optimized for enhanced performance (including EUV sensitivity and etch resistance).

After a proper soaking duration of the metal-containing material 208 on the resist layer 206 so that the metallic compound 207 is sufficiently (such as to a desired concentration) infiltrated into the resist layer 206, the operation 106 may proceed to a step 106C by performing a removal process to remove the excessive portion of the metal-containing material 208 not infiltrated into the resist layer 206 using a suitable removal solution.

The operation 106 may proceed to a step 106D to bake the resist layer 206 after the removal step 106C so that the resist layer 206 is in a proper condition for lithography exposing process. In the present embodiment, the resist layer 206 is prebaked before the infiltration process at the operation 106 so that the infiltration process is more efficient. The baking process may be similar to the soft baking but with a baking temperature lower than the temperature of soft baking. For example, the baking temperature ranges between 60° C. and 80° C. The baking process at the step 106D is designed to drive out the solvent or other liquid and prepare the resist layer 206 for the subsequent exposing process. After the removal of the excessive metal-containing material 208 by step 106C, the resist layer 206 contains a desired concentration of the metallic compound 207 with modified characteristics (e.g., radiation sensitivity and etch resistance), as illustrated in FIG. 5B.

With some technologies (such as ALD or CVD technology), the infiltration process 106 may include a subset of the steps 106A through 106D. For example, in the infiltration process using an ALD technology or a CVD technology, the step 106B is simultaneously implemented with the ALD process. In Furtherance of the example, the substrate 202 is heated and maintained at a higher temperature (such as in a range between 80° C. to 100° C.) while the ALD process (or the CVD process) is implemented to incorporate the metallic compound 207 into the resist layer 206. In some examples of the infiltration process 106, the steps 106C and 106D may be further sequentially implemented after the completion of the ALD or CVD process.

In addition to the above example of alumina as the metallic compound 207, the infiltration process may use different metal-containing precursor to incorporate different metallic compound 207 (different metal or metal oxide) into the resist layer 206, using different metal-containing precursor. For examples, the metallic compound 207 of zinc oxide (ZnO) may use zinc acetate, zinc chloride, and zinc acetylacetonate for metal-containing precursor. For the metallic compound 207 of titanium oxide ($TiO_2$), titanium isopropoxide or titanium tetrachloride with water may be used as metal-containing precursor. For the metallic compound 207 of tungsten (W), the metal-containing precursor may include Bis(tert-butylimino)bis(tert-butylamino) tungsten, Bis(tert-butylimino)bis(dimethylamino) tungsten, Bis(cyclopentadienyl)tungsten, Tungsten hexacarbonyl, or Bis(cyclopentadienyl)tungsten dihydride. For the metallic compound 207 of hafnium (Hf), the metal-containing precursor may include $HfCl_4$ or Hafnium isopropoxide isopropanol. For the metallic compound 207 of tin (Sn), the metal-containing precursor may include Hexamethylditin, $(CH_3)_6Sn_2$. For the metallic compound 207 of zirconium (Zr), the metal-containing precursor may include $ZrCl_4$, or Zirconium (IV) tert-butoxide.

In some embodiments, the infiltration process 106 includes an infiltration process using the metal-containing precursor having two metallic compounds (such as two metal oxides, two metals, or one metal plus one metal oxide). Therefore, two metallic compounds are introduced into the resist layer 206 by one infiltration process 106. For examples, the filtration process introduces a transparent metallic compound and an absorbing metallic compound with proper concentration ratio to enhance the EUV sensitivity of the resist layer 206. A transparent metallic compound refers to a metallic compound transparent to the EUV radiation of the exposing process in the EUV lithography; and an absorbing metallic compound refers to a metallic compound that absorbs the EUV radiation of the exposing process in the EUV lithography. In various examples, the transparent metallic compound includes hafnium (Hf), zirconium (Zr), titanium ($Ti_1$), other transparent metal, corresponding metal oxide, or a combination thereof. In other examples, the absorbing metallic compound includes tin (Sn), aluminum (Al), other absorbing metal, corresponding metal oxide or a combination thereof. The transparent metallic compound is transparent to and does not absorb EUV radiation. However, it causes the EUV radiation to be scattered and travelling longer, therefore increasing the absorption of the EUV radiation by the absorbing metallic compound. Accordingly, the EUV sensitivity of the resist layer 206 is enhanced by the both metallic compounds and is maximized when the ratio of the both is tuned to a proper range. For example, if the absorbing metallic compound has higher absorption, then the concentration of the transparent metallic compound may need to be lower. Otherwise, the concentration of the transparent metallic compound needs to be higher to increase the absorption of the EUV radiation by the absorbing metallic compound.

In some embodiments, the operation 106 includes two infiltration processes implemented sequentially, such as 106(1) and 106(2), each is designed with one metal-containing precursor to introduce one respective metal different from each other. For example, the first infiltration process 106(1) introduces a transparent metallic compound and the second infiltration process 106(2) introduces an absorbing metallic compound. Each infiltration process 106 may include steps 106A through 106D or a subset of the steps 106A through 106D.

Figure 5D:
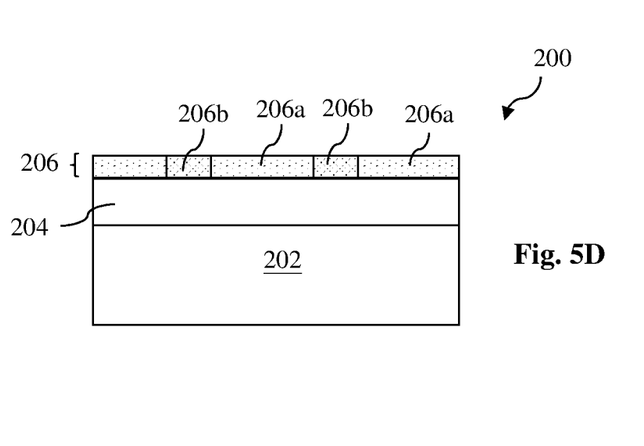

Referring to FIGS. 1 and 5D, the method 100 proceeds to operation 108 by performing an exposing process to the resist layer 206 utilizing an EUV radiation from a lithography system. In the present embodiment, the EUV radiation has a wavelength of 13.5 nm. The operation 108 may be performed in a vacuum. In some embodiments, the radiation beam is directed to the resist layer 206 to form an image of a circuit pattern defined on a photomask (such as a transmissive mask or a reflective mask) in a proper exposing mode such as step-and-scan. Various resolution enhancement techniques, such as phase-shifting, off-axis illumination (OAI) and/or optical proximity correction (OPC), may be used or implemented through the photomask or the exposing process. For examples, the OPC features may be incorporated into the circuit pattern on the photomask. In another example, the photomask is a phase-shift mask, such as an alternative phase-shift mask, an attenuated phase-shift mask, or a chrome-less phase-shift mask. In yet another example, the exposing process is implemented in an off-axis illumination mode. In some other embodiments, the radiation beam is directly modulated with a predefined pattern (such as an IC layout) without using a photomask (such as using a digital pattern generator or direct-write mode). Since the sensitivity of the resist layer 206 is enhanced by the infiltration process and the exposing threshold of the resist layer is lowered, such as lower than 20 $mJ/cm^2$. Accordingly, the exposing process is implemented with the dose less than 20 $mJ/cm^2$, according to the present example.

The operation 108, after the exposing process, may further include other steps, such as thermal treatment. In the present embodiment, the operation 108 includes a post-exposure baking (PEB) process to the semiconductor structure 200, especially to the resist layer 206 coated on the substrate 202. In a specific embodiment, the PEB process may be performed in a thermal chamber at temperature ranging between about 120° C. to about 160° C.

After the exposing process at the operation 108, a latent pattern is formed on the resist layer 206. The latent pattern of a resist layer refers to the exposed pattern on the resist layer, which eventually becomes a physical resist pattern, such as by a developing process. The latent pattern of the resist layer 206 includes unexposed portions 206a and exposed portions 206b. In the present case, the exposed portions 206b of the resist layer 206 are physically or chemically changed. In some examples, the exposed portions 206b are changed by polymerization, such as cross-linked as in negative-tone resist or depolymerized as in positive-tone resist. In other examples, the exposed portions 206b are de-protected, inducing polarity change for dual-tone imaging (to selectively remove exposed portions or non-exposed portions by organic developing solution or aqueous developing solution).

After the exposing process, the method 100 may also include a post-exposure baking (PEB) process.

Figure 5E:
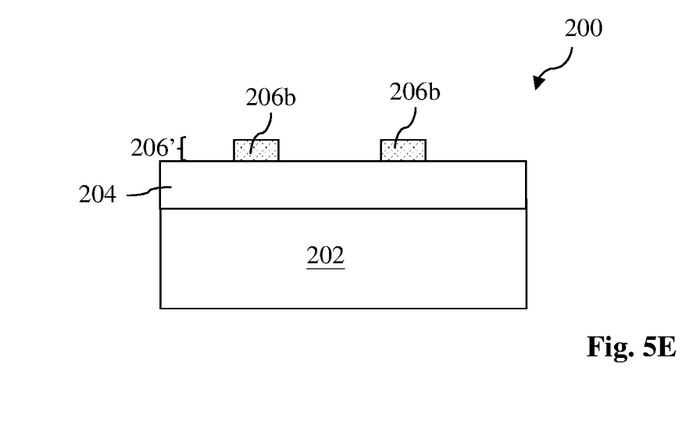

Referring to FIGS. 1 and 5E, the method 100 then proceeds to operation 110 by developing the exposed resist layer 206 in a developer, constructed in accordance with some embodiments. By the developing process, a patterned resist layer 206' is formed. In some embodiments, the resist layer 206 is a negative-tone resist and the exposed portions of the resist layer experience crosslinking and therefore remain after the developing process. In some embodiments, the resist layer 206 experiences a polarity change after the operation 106, and a dual-tone developing process may be implemented. For examples, the exposed portions of resist layer 206 are changed from a nonpolar state (hydrophobic state) to a polar state (hydrophilic state), then the exposed portions 206b will be removed (positive tone imaging) by an aqueous solvent, such as tetramethyl ammonium hydroxide (TMAH), or alternatively the unexposed portions 206a will be removed (negative tone imaging) by an organic solvent, such as butyl acetate. In some other examples, the resist layer 206 is changed from a polar state to a nonpolar state, then the exposed portions 206b will be removed (positive-tone imaging) by an organic solvent or the unexposed portions 206a will be removed (negative-tone imaging) by an aqueous solvent.

In some example illustrated in FIG. 5E, the unexposed portions 206a are removed in the developing process. In this example shown in FIG. 5E, the patterned resist layer 206' is represented by a two-line pattern (this type of resist is referred to as negative tone resist). However, the following discussion is equally applicable to resist patterns represented by trenches.

Figure 5F:
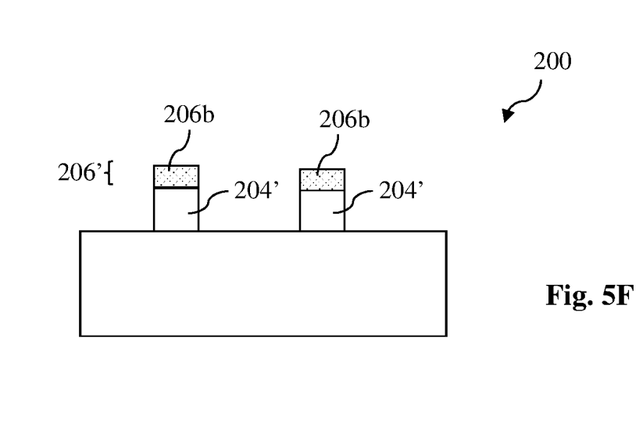

Referring to FIGS. 1 and 5F, the method 100 includes an operation 112 by performing a fabrication process to the semiconductor structure 200 using the patterned resist layer 206' as a mask such that the fabrication process is only applied to the portions of the semiconductor structure 200 within the openings of the patterned resist layer 206' while other portions covered by the patterned resist layer 206' are protected from being impacted by the fabrication process. In some embodiments, the fabrication process includes an etching process applied to the underlayer 204 using the patterned resist layer 206' as an etch mask, thereby transferring the pattern from the patterned resist layer 206' to the underlayer 204. In alternative embodiments, the fabrication process includes an ion implantation process applied to the semiconductor structure 200 using the patterned resist layer as an implantation mask, thereby forming various doped features in the semiconductor structure 200.

Figure 5G:
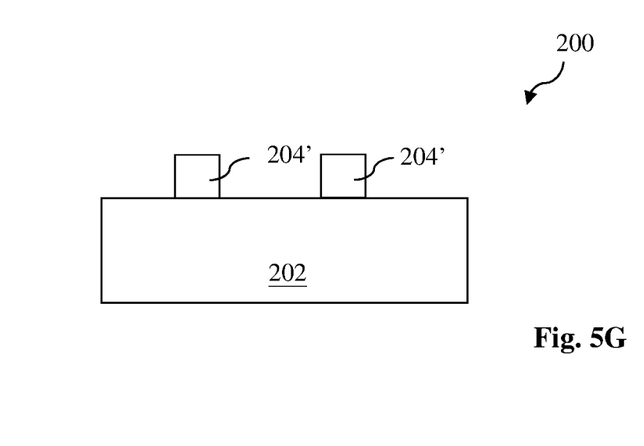

In the present example, the underlayer 204 is a hard mask. To further this embodiment, the pattern is first transferred from the patterned resist layer 206' to the hard mask layer 204, then to other layers of the substrate 202. For example, the hard mask may be etched through openings of the patterned resist layer 206' using a dry (plasma) etching, a wet etching, and/or other etching methods. The dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 206' may be partially consumed during the etching of the hard mask 204. In an embodiment, the remaining portion of the patterned resist layer 206' may be stripped off, leaving a patterned hard mask 204' over the substrate 202, as illustrated in FIG. 5G.

Although not shown in FIG. 1, the method 100 may include other operations before, during or after the operations described above. In an embodiment, the substrate 202 is a semiconductor substrate and the method 100 proceeds to forming fin field effect transistor (FinFET) structures. In this embodiment, the method 100 includes forming a plurality of active fins in the substrate 202. In furtherance of the embodiment, the operation 110 further includes etching the substrate 202 through the openings of the patterned hard mask 204' to form trenches in the substrate 202; filling the trenches with a dielectric material; performing a chemical mechanical polishing (CMP) process to form shallow trench isolation (STI) features; and epitaxy growing or recessing the STI features to form fin-like active regions. In another embodiment, the method 100 includes other operations to form a plurality of gate electrodes in the substrate 202. The method 100 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 202, which has been etched by operation 110 to form a plurality of trenches. The method 100 proceeds to filling the trenches with a conductive material, such as a metal; and further proceeds to polishing the conductive material using a process such as chemical mechanical planarization (CMP) to expose the patterned ILD layer, thereby forming the metal lines in the ILD layer. The above are non-limiting examples of devices/structures that can be made and/or improved using the method 100 and the resist layer 206 according to various aspects of the present disclosure.

With the disclosed method 100, EUV sensitivity and etch resistance of the resist layer 206 are enhanced without introducing new resist material but only with an infiltration process, which is cost-effective in IC fabrication. Furthermore, the resist can be tuned through the infiltration according to individual applications. In some embodiments, by infiltration, the metal or metal oxide incorporated into the resist layer may have graded concentration with a highest concentration at a top surface to a lowest concentration at a bottom surface of the photoresist layer.

The disclosed lithography process with infiltration to incorporate metal or metal oxide for increased EUV sensitivity and etch resistance may have other embodiments, such as those described below with FIGS. 2-4. Some operations in those methods are similar to those of the method 100 and are not described in detail for simplicity.

Figure 2:
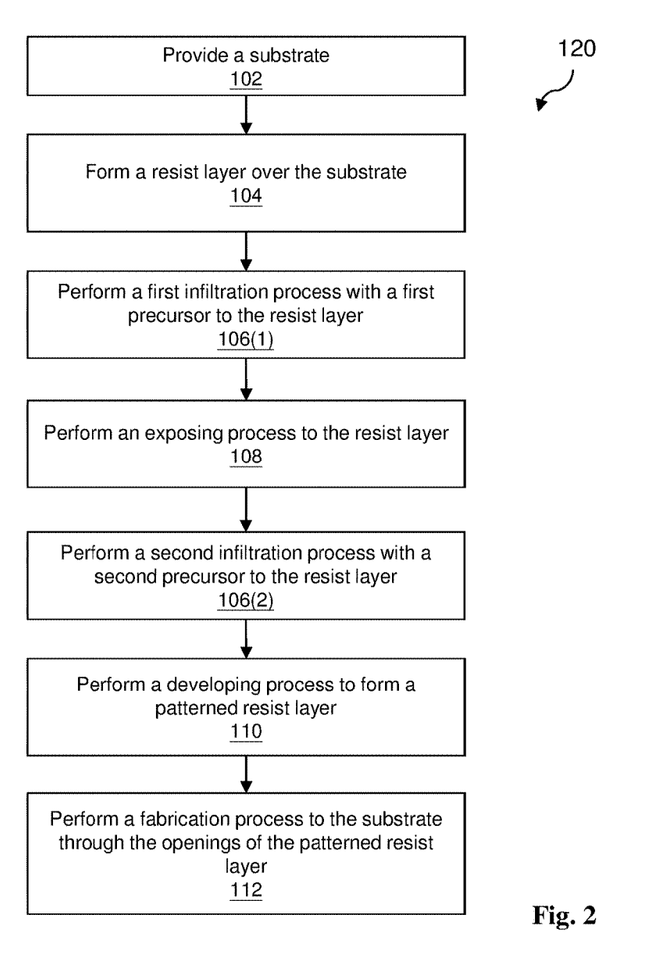
FIGS. 2, 3 and 4 illustrate flowcharts of a lithography patterning method in accordance with various embodiments.

FIG. 2 is a flowchart of a method 120 constructed in accordance with some embodiments. The method 120 begins at block 102 by providing a substrate 202, as illustrated in FIG. 5A. The method 120 proceeds to an operation 104 to form a resist layer 206 over the substrate 202. The method 120 includes two filtration processes implemented in particular sequence. The two filtration processes are referred to as a first filtration process 106(1) and a second filtration process 106(2), respectively.

In the present case, the method 120 proceeds to perform a first infiltration process 106(1) to the resist layer 206 with a first precursor 208 such that a first metallic compound 207 (first metal or metal oxide) is introduced to enhance the EUV sensitivity of the resist layer 206, as illustrated in FIG. 5B. In some embodiments, the first metallic compound 207 is chosen to enhance the EUV sensitivity. Alternatively, the first infiltration process 106(1) may include two infiltration procedures, each including steps 106A-106D or a subset thereof designed to introduce respective metallic compound, such as one to introduce an absorbing metallic compound and another to introduce a transparent metallic compound, similar to the one described in the method 100. The operation 106(1) is implemented before the exposing process. For example, the operation 106(1) includes one infiltration procedure to introduce tin (Sn) and another infiltration procedure to introduce hafnium to the resist layer 206.

Thereafter, the method 120 proceeds to an operation 108 by performing an exposing process to the resist layer 206, thereby forming a latent patent on the resist layer 206 as illustrated in FIG. 5D. The resist layer 206 is treated by the first infiltration process 106(1) and has an enhanced EUV sensitivity to the exposing process. After the exposing process, the method 120 may also include a PEB process, according to some embodiments.

Figure 6A:
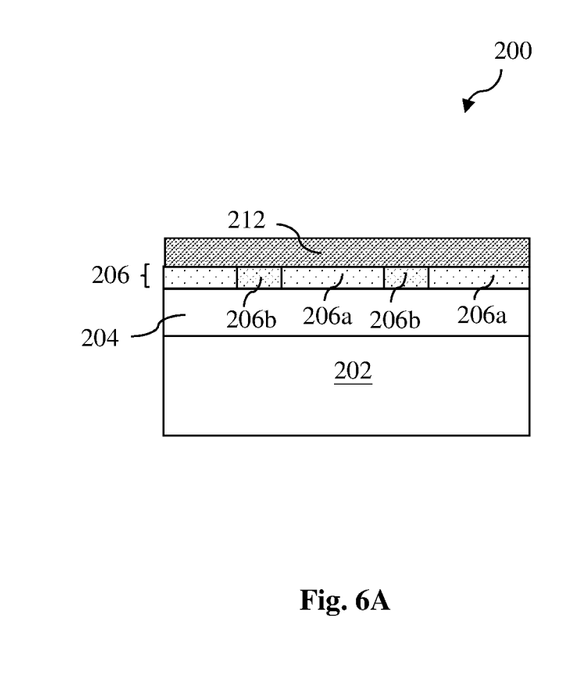
FIGS. 6A and 6B illustrate cross-sectional views of a semiconductor structure at various fabrication stages, in accordance with some embodiments.

Thereafter, the method 120 proceeds to perform a second infiltration process 106(2) to the exposed resist layer 206 with a suitable metal-containing precursor such that another metallic compound is introduced to the resist layer 206. For example, the metal-containing material 212 (similar to the metal-containing material 208 in FIG. 5C) may be formed on the resist layer 206 by a suitable infiltration process (such as spin-on coating described before), as illustrated in FIG. 6A. The second infiltration process 106(2) is designed to enhance the etch resistance of the resist layer 206. For example, the second infiltration process 106(2) introduces alumina to the resist layer 206. The second infiltration process 106(2) is implemented after the exposing process and the PEB process, therefore having less liquid in the resist layer 206 and in a better condition for the second infiltration process.

The method 120 also includes an operation 110 to perform a developing process, thereby forming a patterned resist layer 206', as illustrated in FIG. 5E; and an operation 112 to perform a fabrication process to the semiconductor structure 200, such as patterning the underlayer 204 to form a patterned underlayer 204' as illustrated in FIG. 5F.

Figure 6B:
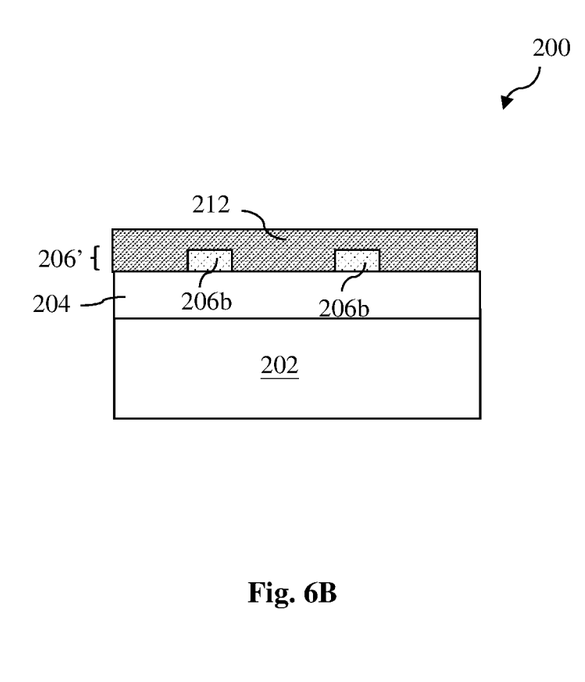

Alternatively, the operation 106(2) is implemented after the operation 110 for the developing process, as illustrated in FIG. 6B. This is advantages for the second infiltration process since the patterned resist layer 206' has more surfaces: top surfaces and sidewall surfaces as well for infiltration. The second precursor 212 is disposed on the top surfaces and sidewall surfaces of the patterned resist layer 206', therefore the second infiltration process is more effective.

Figure 3:
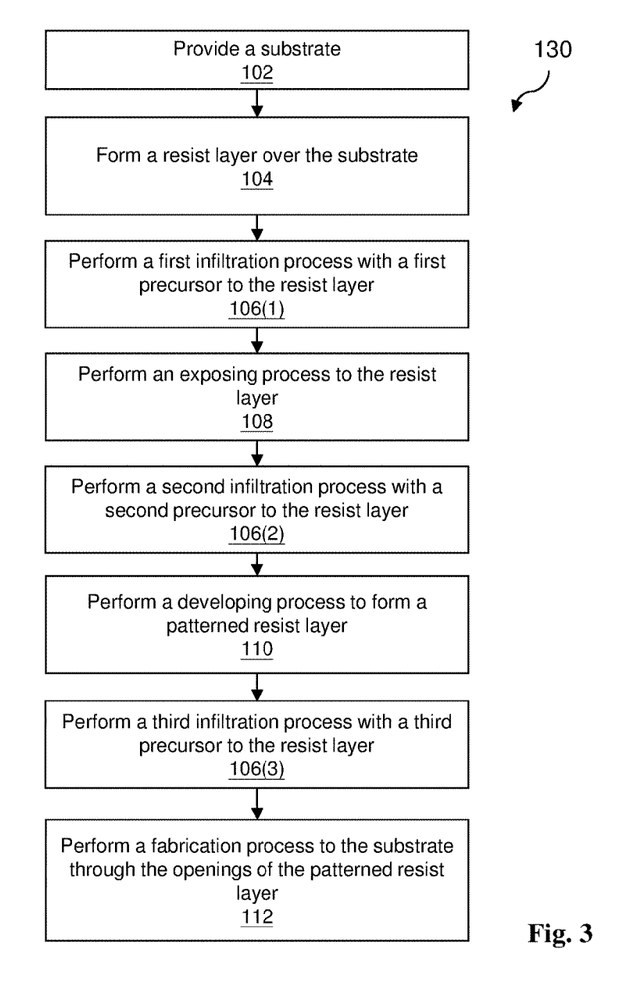

FIG. 3 is a flowchart of a method 130 constructed in accordance with some embodiments. The method 130 begins at block 102 by providing a substrate 202, as illustrated in FIG. 5A. The method 120 proceeds to an operation 104 to form a resist layer 206 over the substrate 202.

The method 130 proceeds to a first infiltration process 106(1) applied to the resist layer 206 with a first precursor 208 such that a first metal or metal oxide is introduced to enhance the EUV sensitivity of the resist layer 206, as illustrated in FIG. 5B. The metallic compound 207 is chosen to enhance the EUV sensitivity. Alternatively, the operation 106(1) may include two infiltration procedures, each including steps 106A-106D or a subset thereof designed to introduce respective metallic compound 207, such as one to introduce an absorbing metal and another to introduce a transparent metal, similar to the one described in the method 100. The operation 106(1) is implemented before the exposing process. For example, the operation 106(1) includes one infiltration to introduce tin (Sn) and another infiltration to introduce hafnium to the resist layer 206.

Thereafter, the method 130 proceeds to an operation 108 by performing an exposing process to the resist layer 206, thereby forming a latent patent on the resist layer 206 as illustrated in FIG. 5D. The resist layer 206 is treated by the first infiltration process 1106(1) and has an enhanced EUV sensitivity to the exposing process. After the exposing process, the method 130 may also include a PEB process.

Thereafter, the method 130 proceeds to a second infiltration process 106(2) applied to the exposed resist layer 206 with a second metal-containing precursor such that a second metallic compound is introduced to the resist layer 206. The second infiltration process 106(2) is designed to enhance the etch resistance of the resist layer 206. For example, the second infiltration process 106(2) introduces alumina to the resist layer 206. The operation 106(2) is implemented after the exposing process.

The method 120 also includes an operation 110 to perform a developing process, thereby forming a patterned resist layer 206', as illustrated in FIG. 5E.

Figure 7:
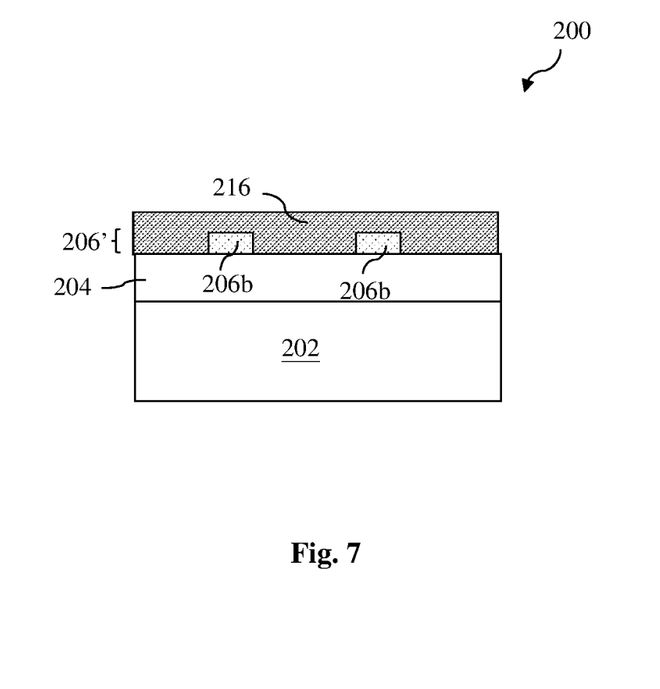
FIG. 7 illustrates a cross-sectional view of a semiconductor structure at various fabrication stages, in accordance with some embodiments.

Thereafter, the method 130 proceeds to a third infiltration process 106(3) to the patterned resist layer 206' with a third precursor 216 such that a third metal or metal oxide is introduced to the patterned resist layer 206', as illustrated in FIG. 7. This is advantageous for the third infiltration process for the same reason described in the method 120. Particularly, the third precursor 216 is disposed on the top surfaces and sidewall surfaces of the patterned resist layer 206', therefore the third infiltration process is more effective. The second infiltration process 106(2) and the third infiltration process 106(3) are designed to introduce two different metal or metal oxide to increase the etch resistance of the resist layer. For example, the second infiltration process introduces alumina and the third infiltration process introduces aluminum nitride (AlN) into the resist layer for greater etch resistance.

Furthermore, the first infiltration process 106(1); the second infiltration process 106(2); and the third infiltration process 106(3), each may include the steps 106A through 106D, as described above.

The method 130 proceeds to an operation 112 to perform a fabrication process, such as an etching process, to the substrate 202, as illustrated in FIG. 5F.

Figure 4:
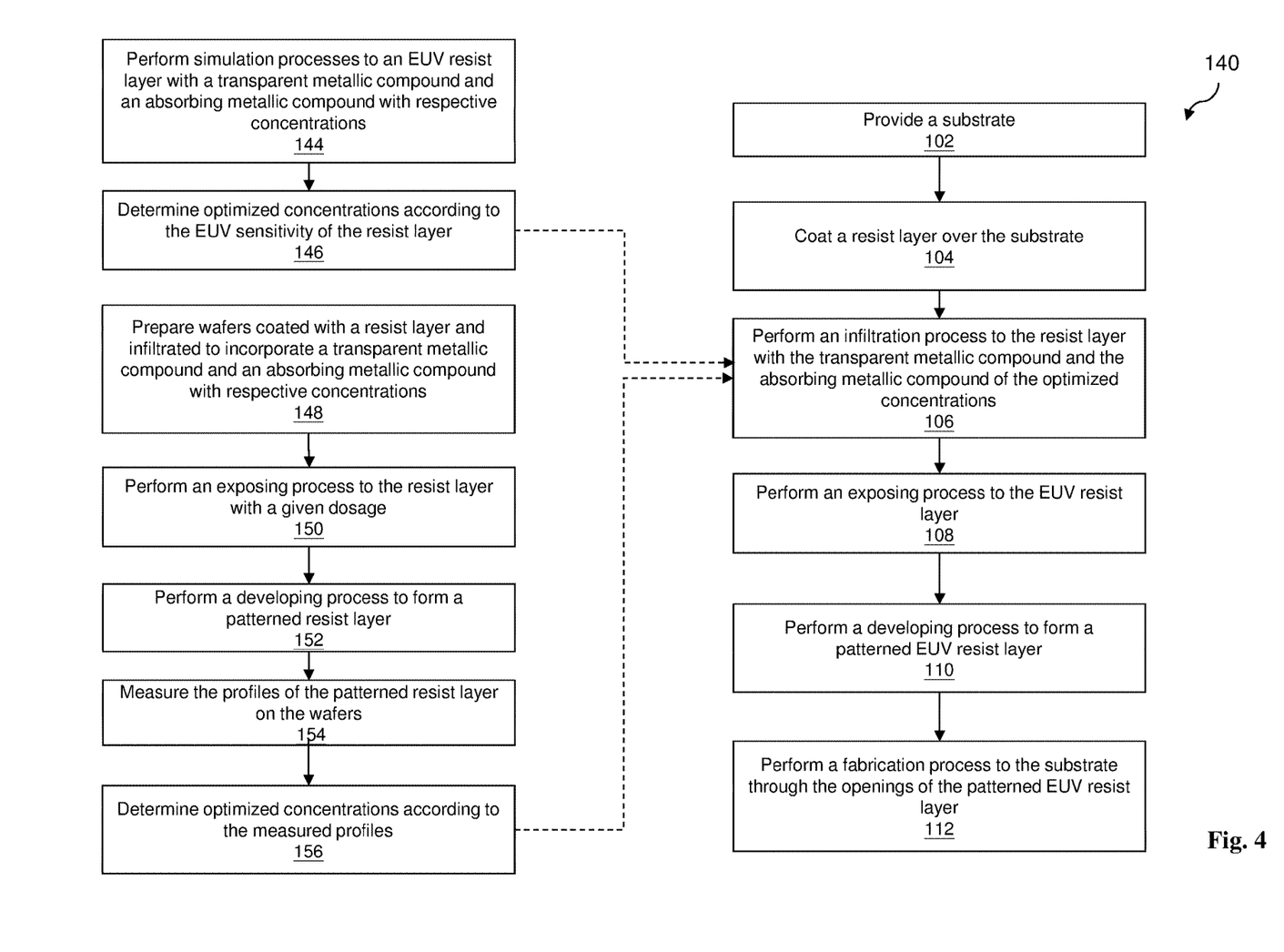

FIG. 4 is a flowchart of a method 140 for a lithography process constructed in accordance with some embodiments. To enhance the EUV sensitivity of a resist layer, both absorbing and transparent metallic compound are introduced into the resist layer by infiltration with a certain concentration ratio. As stated above, the transparent metallic compound is transparent to and does not absorb the EUV radiation. However, it causes the EUV radiation to be scattered and travelling longer, therefore increasing the absorption of the EUV radiation by the absorbing metallic compound. Accordingly, the EUV sensitivity of the resist layer 206 is enhanced by the both metallic compounds and may be maximized when the ratio of the both is tuned to a proper range. For example, if the absorbing metallic compound has higher absorption, then the concentration of the transparent metallic compound may need to be lower. Too high concentration of transparent metallic compound in the resist layer 206 may reduce the EUV absorption and even reduce the resolution since it may take longer path before EUV radiation is absorbed in the resist layer. Otherwise, the concentration of the transparent metallic compound needs to be higher to increase the absorption of the EUV radiation by the absorbing metallic compound. On other side, if only absorbing metallic compound is used and the absorption thereby is higher, the EUV radiation in the exposing process may be substantially absorbed by top portion of the resist layer 206, causing nonuniform exposure through resist depth and footing issue after developing. Therefore, the method 140 provides a procedure for infiltration to introduce absorbing metallic compound and transparent metallic compound with optimized concentrations or ratio.

The method 140 includes various operations, such as 102, 104, 108, 110 and 112 described before. The method 140 also includes an operation 106 to perform an infiltration process to the resist layer 206 before the exposing process at the operation 108 to increase the EUV sensitivity of the resist layer 206. However, the infiltration process 106 introduces both a transparent metal and an absorbing metal with optimized concentrations. In some embodiments, the optimized concentrations are determined by simulation as described in operations 144 and 146, or alternatively determined by experiments, as described in operations 148 through 156. The method 140 may include additional infiltration process after the exposing process as described in the methods 100, 120 and 130. Each infiltration process may include steps 106A through 106D.

In the simulation procedure, the method 140 includes an operation 144 by performing simulation processes to an EUV resist layer with a transparent metallic compound and an absorbing metallic compound with respective concentrations; and an operation 146 by determining optimized concentrations according to the EUV sensitivity of the resist layer. Then, the method 140 provides the optimized concentrations to the infiltration process of the operation 106.

In the experiment procedure, the method 140 begins at an operation 148 by preparing wafers coated with a resist layer and infiltrated with a transparent metal and an absorbing metal with respective concentrations; an operation 150 by performing an exposing process to the resist layer with a given dosage; an operation 152 by performing a developing process to form a patterned resist layer; an operation 154 by measuring the profiles of the patterned resist layer to the wafers; and an operation 156 by determining optimized concentrations according to the measured profiles. Then, the method 140 provides the optimized concentrations to the infiltration process of the operation 106.

The present disclosure provides a lithography process with an infiltration process to incorporate metal or metal oxide into the resist layer, thereby enhancing the EUV sensitivity and the etch resistance of the resist layer during EUV lithography. The method may include more infiltration processes and some infiltration processes are implemented after the exposing process. By implementing the disclosed method in various embodiments, some of advantages described below may present. However, it is understood that different embodiments disclosed herein offer different advantages and that no particular advantage is necessarily required in all embodiments. As one example, it is not needed to adopt new resist material, which is not cost-effective and is not application specific. In another example, the infiltration process can be tuned for individual applications. Furthermore, both EUV sensitivity and etch resistance of the resist material are enhanced. In some other examples, the hard mask may be eliminated due to the increased etch resistance.

In one example aspect, the present disclosure provides a method of semiconductor fabrication. The method includes forming a photoresist layer over a substrate; performing an infiltration process to introduce a metallic compound into the photoresist layer to enhance a sensitivity of the photoresist layer to an extreme ultraviolet (EUV) radiation; performing an exposing process to the photoresist layer using the EUV radiation; and performing a developing process to the photoresist layer to form a patterned resist layer.

Another one aspect of the present disclosure pertains to a method of semiconductor fabrication. The method includes forming a photoresist layer over a substrate; performing a first infiltration process to the photoresist layer using a first metal-containing chemical to enhance a sensitivity of the photoresist layer to an extreme ultraviolet (EUV) radiation; performing an exposing process to the photoresist layer using the EUV radiation; performing a second infiltration process to the photoresist layer using a second metal-containing chemical that is different from the first metal-containing chemical; and performing a developing process to the photoresist layer to form a patterned photoresist layer.

Yet another aspect of the present disclosure pertains to a semiconductor structure. The semiconductor structure includes forming a photoresist layer over a semiconductor substrate; performing a first infiltration process to introduce a first metal into the photoresist layer; performing a second infiltration process to introduce a second metal into the photoresist layer, the second metal being different from the first metal; performing an exposing process to the photoresist layer using the EUV radiation, with both the first and second metals in the photoresist layer enhancing a sensitivity of the photoresist layer to an extreme ultraviolet (EUV) radiation; and performing a developing process to the photoresist layer to form a patterned photoresist layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   forming a photoresist layer over a substrate;
   performing a first infiltration process to the photoresist layer using a first metal-containing precursor to enhance a sensitivity of the photoresist layer to an extreme ultraviolet (EUV) radiation;
   performing an exposing process to the photoresist layer using the EUV radiation;
   after the exposing process to the photoresist layer is performed, performing a second infiltration process to the photoresist layer using a second metal-containing precursor; and
   after a second infiltration process, performing a developing process to the photoresist layer to form a patterned resist layer.

2. The method of claim 1, wherein the performing of the first infiltration process includes performing the first infiltration process to introduce a first metallic compound and a second metallic compound to the photoresist layer, wherein the second metallic compound is different from the first metallic compound in composition.

3. The method of claim 2, wherein the first metallic compound includes tin (Sn) and the second metallic compound includes hafnium (Hf).

4. The method of claim 2, wherein the first metallic compound is absorptive to the EUV radiation and the second metallic compound is transparent to the EUV radiation.

5. The method of claim 4, wherein
   the first metallic compound includes one of tin (Sn), aluminum (Al), tin oxide, alumina, and a combination thereof; and
   the second metal includes one of hafnium (Hf), zirconium (Zr), titanium (Ti), hafnium oxide, zirconium oxide, titanium oxide, and a combination thereof.

6. The method of claim 2, wherein the metal-containing precursor is designed to introduce the first metallic compound with a first concentration and the second metallic compound with a second concentration, wherein the first and second concentrations corresponds to a maximized sensitivity of the photoresist layer to the EUV radiation.

7. The method of claim 1, wherein the first infiltration process introduces a first metallic compound to the photoresist layer and the second infiltration process introduces a second metallic compound into the photoresist layer, the second metallic compound being different from the first metallic compound in composition.

8. The method of claim 7, further comprising performing a third infiltration process to introduce a third metallic compound into the photoresist layer after the performing of the developing process, thereby enhancing etch resistance of the photoresist layer, the third metallic compound being different from the first and second metallic compounds in composition.

9. The method of claim 1, wherein the performing each of the first and second infiltration processes includes coating a metal-containing material on the photoresist layer and heating the metal-containing material.

10. The method of claim 9, wherein the heating of the metal-containing material includes heating the metal-containing material to a given high temperature before the coating of the metal-containing material to the photoresist layer.

11. The method of claim 10, wherein the heating of the metal-containing material includes heating the metal-containing material using one of microwave radiation and infrared radiation.

12. The method of claim 9, wherein the heating of the metal-containing material includes heating the substrate.

13. The method of claim 1, wherein the performing of the second infiltration process includes performing the second infiltration process to enhance the etch resistance of the photoresist layer.

14. A method for lithography patterning, comprising:
forming a photoresist layer over a substrate;
performing a first infiltration process to introduce a first metallic compound into the photoresist layer to have a graded concentration with a highest concentration at a bottom surface to a lowest concentration at a top surface of the photoresist layer, and thereby to enhance a sensitivity of the photoresist layer to an extreme ultraviolet (EUV) radiation;
performing an exposing process to the photoresist layer using the EUV radiation;
performing a second infiltration process to introduce a second metallic compound into the photoresist layer to enhance etch selectivity of the photoresist layer; and
performing a developing process to the photoresist layer to form a patterned photoresist layer.

15. The method of claim 14, wherein
the performing of the first infiltration process includes performing the first infiltration process using a first metal-containing precursor to introduce the first metallic compound to the photoresist layer prior to the performing of the exposing process; and
the performing of the second infiltration process includes performing the second infiltration process using a second metal-containing precursor to introduce the second metallic compound to the photoresist layer after the performing of the exposing process and before the performing of the developing process, wherein the second metallic compound is different from the first metallic compound in composition.

16. The method of claim 14, wherein the performing of the first infiltration process includes performing the first infiltration process to introduce the first metallic compound to the photoresist layer prior to the performing of the exposing process; and
the performing of the second infiltration process includes performing the second infiltration process to introduce the second metallic compound to the photoresist layer after the performing of the exposing process and prior to the performing of the developing process, wherein the second metallic compound is different from the first metallic compound.

17. The method of claim 16, wherein
the first metallic compound is an absorbing metallic compound including one of tin (Sn), aluminum (Al), tin oxide, alumina, and a combination thereof; and
the second metallic compound is a transparent metallic compound including one of hafnium (Hf), zirconium (Zr), titanium (Ti), hafnium oxide, zirconium oxide, titanium oxide, and a combination thereof.

18. The method of claim 16, further comprising performing a third infiltration process to introduce a third metallic compound into the photoresist layer to enhance etch resistance after the performing of the developing process, the third metallic compound being different from the first and second metallic compounds in composition.

19. A method for lithography patterning, comprising:
forming a photoresist layer over a substrate;
performing an exposing process to the photoresist layer using the EUV radiation, forming an exposed photoresist layer;
performing an infiltration process to introduce a metallic compound into the exposed photoresist layer to enhance etch selectivity of the photoresist layer; and
thereafter, performing a developing process to the exposed photoresist layer to form a patterned photoresist layer.

20. The method of claim 1, wherein the performing of the first infiltration process includes performing the first infiltration process to introduce a metallic compound to the photoresist layer to have a graded concentration with a highest concentration at a bottom surface to a lowest concentration at a top surface of the photoresist layer.

* * * * *